United States Patent
Inada

(10) Patent No.: US 7,968,963 B2
(45) Date of Patent: Jun. 28, 2011

(54) PHOTODIODE ARRAY AND IMAGE PICKUP DEVICE USING THE SAME

(75) Inventor: Hiroshi Inada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 255 days.

(21) Appl. No.: 12/420,656

(22) Filed: Apr. 8, 2009

(65) Prior Publication Data
US 2010/0258894 A1     Oct. 14, 2010

(51) Int. Cl.
*H01L 27/146* (2006.01)
(52) U.S. Cl. ............... 257/443; 257/447; 257/E31.057
(58) Field of Classification Search ............ 257/438, 257/443, 447, 452, E31.057
See application file for complete search history.

(56) References Cited

U.S. PATENT DOCUMENTS
4,129,878 A * 12/1978 Webb ........................... 257/438
5,157,473 A * 10/1992 Okazaki ........................ 257/438

OTHER PUBLICATIONS

Cohen et al., "Near-IR imaging cameras operate at room temperature", Laser Focus World, pp. 109-113 (1993).

* cited by examiner

*Primary Examiner* — Kiesha R Bryant
*Assistant Examiner* — Tucker Wright
(74) *Attorney, Agent, or Firm* — Venable LLP; Michael A. Sartori; Leigh D. Thelen

(57) ABSTRACT

A photodiode array with reduced optical crosstalk and an image pickup device using it are provided. The photodiode array 10 according to the present invention has an anti-crosstalk portion B dividing each adjacent pair of photodiodes S, the anti-crosstalk portion B and the photodiodes S individually have a p-type area 16 extending inward from the surface side of a semiconductor laminate, and the inner end of the p-type area of the anti-crosstalk portion, namely the front, is closer to the back surface of the semiconductor laminate than the front of the p-type area of each of the photodiodes.

4 Claims, 2 Drawing Sheets

PHOTODIODE ARRAY AND IMAGE PICKUP DEVICE USING THE SAME

BACKGROUND OF THE INVENTION

1. Field of the Invention

The present invention relates to a photodiode array and an image pickup device and, in particular, a photodiode array having photosensitivity at the long-wavelength side including the near infrared region and an image pickup device using the photodiode array.

2. Description of the Related Art

Group III-V compound-based semiconductors have recently been drawing attention as compound semiconductors having a band gap energy corresponding to the near infrared region or a region of longer wavelengths, and thus research and development thereof is underway. An example of a disclosed application of such a compound is a night-vision camera that receives natural light at night by means of a photodiode array constituted of photodiodes having an InGaAs-based absorption layer that undergoes lattice matching with an InP substrate and that is arranged on the InP substrate (see Marshall J. Cohen and Gregory H. Olsen "Near-IR imaging cameras operate at room temperature," LASER FOCUS WORLD, June 1993, pp. 109-113). Such a night-vision camera allows for image pickup under natural light without artificial lighting regardless of whether it is dark or rainy.

Such night-vision cameras, however, cannot provide clear images. This is because a two-dimensional photodiode array receiving incident light coming from the plane of incidence, the back surface of the InP substrate, experiences optical crosstalk occurring between adjacent photodiodes; this optical crosstalk reduces effective resolution, thereby resulting in blurred images.

SUMMARY OF THE INVENTION

The present invention provides a photodiode array with reduced optical crosstalk and an image pickup device using the photodiode array.

The photodiode array according to the present invention is an array of photodiodes arranged on a semiconductor laminate having a first conductivity-type semiconductor layer, an absorption layer located above the first conductivity-type semiconductor layer, and a window layer formed on the surface of the absorption layer. The photodiode array further has an anti-crosstalk portion between each adjacent pair of the photodiodes. Each of the photodiodes has a second conductivity-type area extending inward from the surface side of the semiconductor laminate. The anti-crosstalk portion also has such a second conductivity-type area, and the inner end of the second conductivity-type area of the anti-crosstalk portion, namely the front, is closer to the back surface of the semiconductor laminate than the front of the second conductivity-type area of each of the photodiodes. Here, the term "an absorption layer located above the first conductivity-type semiconductor layer" means that the absorption layer is closer to the surface of the semiconductor laminate than the first conductivity-type semiconductor layer and may be in contact with the first conductivity-type semiconductor layer or not. The semiconductor laminate may have a semiconductor substrate, and the first conductivity-type semiconductor layer may be the semiconductor substrate. The absorption layer may assume any conductivity type, for example, the first conductivity type or an intrinsic conductivity type.

The configuration described above is premised on that the back surface is used as the plane of incidence. Carriers resulting from scattered light can be trapped using a depletion layer existing in the vicinity of the pn junction of the anti-crosstalk portion, where the distance between the front of the second conductivity-type area thereof and the back surface of the semiconductor laminate being smaller. Furthermore, carriers occurring in the vicinity of the pn junction of each of the photodiodes, where the distance between the front of the second conductivity-type area thereof and the back surface of the semiconductor laminate being larger, are allowed to contribute to light signals. This leads to that the anti-crosstalk portion projecting out over the plane of incidence blocks oblique incident light having a large incident angle, thereby ensuring highly reliable prevention of optical crosstalk.

Meanwhile, the anti-crosstalk portion may have a structure surrounding the individual photodiodes on the same plane. Such a structure would provide photodiodes surrounded by the anti-crosstalk portion, thereby preventing optical crosstalk more reliably.

The thickness of the window layer may be larger in the anti-crosstalk portion than in the photodiodes. This configuration would enable formation of the photodiodes and anti-crosstalk portion with the distance between the front of the second conductivity-type area thereof to the back surface of the semiconductor laminate being different each other simply by diffusing second conductivity-type impurities once.

Those possible structure is one in which the second conductivity-type area of each of the photodiodes extends only within the window layer and that of the anti-crosstalk portion reaches the absorption layer. In such a structure, the individual photodiodes, having the front of the second conductivity-type area relatively distant from the back surface of the semiconductor laminate, have a depletion layer with a limited area. Thus, the area in which light-induced carriers are generated is also limited and accordingly absorption of oblique incident light and scattered light is prevented. As a result, optical crosstalk is reduced.

An image pickup device obtained by mounting any of the photodiode arrays described above with the epi-side facing down so that the back surface thereof is used as the plane of incidence provides clear images due to highly reliable prevention of optical crosstalk. It should be noted that the image pickup device may take any form as long as it uses signals of received light emitted by photodiodes to analyze the signals with respect to the positions of the photodiodes and thus may be a camera, a sensor, a photodetector, or the like.

The front of the second conductivity-type area of the anti-crosstalk portion described above may be exposed to reverse-bias voltage. This would enable trapping of carriers resulting from scattered light in a depletion layer having an extended area brought about by the application of reverse-bias voltage and then recombining the carriers there, thereby significantly promoting the prevention of optical crosstalk.

The photodiode array and image pickup device according to the present invention ensure the prevention of optical crosstalk that occurs between adjacent photodiodes.

DESCRIPTION OF THE PREFERRED EMBODIMENTS

Figure 1:
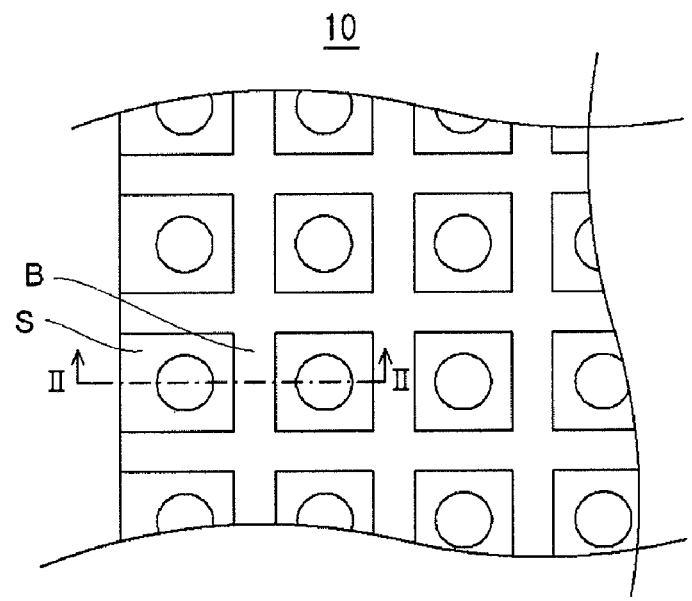
FIG. 1 is a plan view of a photodiode array according to an embodiment of the present invention.

FIG. 1 is a plan view of an end of a photodiode array 10 according to an embodiment of the present invention. In FIG. 1, sensing portions S, each of which is a photodiode or a photoreceptor, are arranged in a two-dimensional square array. An anti-crosstalk portion B surrounds the sensing portions S arranged in a two-dimensional square array. The anti-crosstalk portion B extends in four orthogonal directions like passages, whereas the sensing portions S exist as compartments separated by the passages. The width of the anti-crosstalk portion B, namely the width of each of the passages, is preferably in the range of 5 to 30 μm, and the light-receiving diameter of each of the photodiodes is preferably in the range of 30 to 100 μm.

Figure 2:
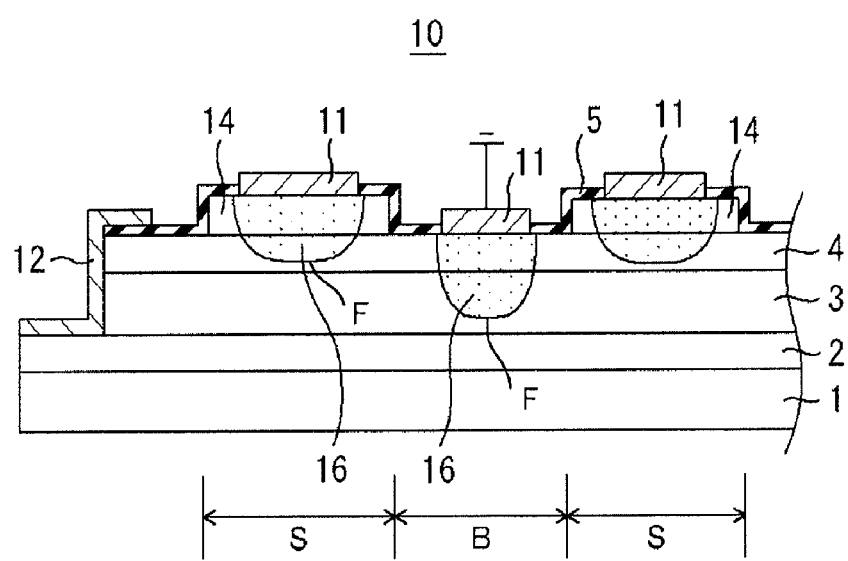
FIG. 2 is a cross-sectional view of FIG. 1 along the line II-II.
Figure 2:

FIG. 2 is a cross-sectional diagram of FIG. 1 along the line II-II. In FIG. 2, the photodiode array 10 has a semiconductor laminate constituted of an InP substrate 1, an n-type (first conductivity-type) InP buffer layer 2, a GaInNAs absorption layer 3, and an InP window layer 4. The GaInNAs absorption layer 3 has photosensitivity at the long-wavelength side including the near infrared region and may further contain Sb and/or P. Sb improves the crystallinity. When the photosensitivity requirement at the long-wavelength side including the near infrared region is low, a GaInAs absorption layer, containing no nitrogen, may be used instead. The window layer 4 may be made of any composition other than InP as long as it undergoes lattice matching with the absorption layer 3 and has a larger band gap than the absorption layer 3. Other structures are also possible, for example: a structure in which the absorption layer has type 2 multiquantum wells consisting of InGaAs/GaAsSb or GaInNAs/GaAsSb, and a diffusive-concentration-distribution-adjusting layer made of InGaAs is disposed between this absorption layer and the window layer. Although the anti-crosstalk portion B is constituted solely of the semiconductor laminate, the photodiodes S further each have an InP additional layer 14 formed on the InP window layer 4, and thus the anti-crosstalk portion B and the photodiodes S have different heights. The series of the InP window layer 4 and the InP additional layer 14 which is a part of the individual photodiodes S, can be regarded as equivalent to the InP window layer 4 which is a part of the anti-crosstalk portion B except that the former has a larger thickness. It should be noted that, as described earlier, the width of the anti-crosstalk portion B is approximately ⅕ to ⅓ of the diameter of each of the photodiodes S and thus, in fact, much smaller than that shown in FIGS. 1 and 2.

An impurity-diffusing mask pattern 5 contains SiN, extends over the anti-crosstalk portion B and the photodiodes S, and has openings positioned on both. A p-type (second conductivity-type) area 16, which is composed of Zn atoms introduced from the openings of the mask pattern 5, is relatively deep and close to the InP substrate 1 in the anti-crosstalk portion B, whereas the p-type area 16 of each of the photodiodes S is more distant from the InP substrate 1 than that of the anti-crosstalk portion B because of the InP additional layer 14. In particular, in FIG. 2, the p-type area 16 of the anti-crosstalk portion B reaches the GaInNAs absorption layer 3, whereas those of the photodiodes S extend only to the InP window layer 4. Therefore, an embodiment of the present invention is characterized in that the distance between the front F of the p-type area 16 and the back surface of the InP substrate 1 is smaller in the anti-crosstalk portion B than in the photodiodes S.

As described above, the distance between the front F of the p-type area 16 and the back surface of the InP substrate 1 providing the plane of incidence, namely the distance to the light-receiving point, differs between the photodiodes S and the anti-crosstalk portion B. The p-type areas 16 contain more abundant impurities than the GaInNAs absorption layer 3. The anti-crosstalk portion B and the photodiodes S individually have a depletion layer extending from the front F of the p-type area 16 thereof toward the GaInNAs absorption layer 3, and the depletion layer traps light passing therethrough. The depletion layers, which are relatively small, however, spontaneously emerge in the pn junctions. In particular, the anti-crosstalk portion B exposed to reverse-bias voltage would have larger depletion layers, and these extended depletion layers would provide deep and large anti-crosstalk walls between the adjacent photodiodes S. In the photodiode array 10 shown in FIG. 2, however, the p-type areas 16 of the photodiodes S extend only to the InP additional layer 14 or the InP window layer 4. Thus, the extension of the depletion layers is limited, and light signals are detected only in the vicinity of the pn junctions. In this way, optical crosstalk is reduced.

Figure 3:
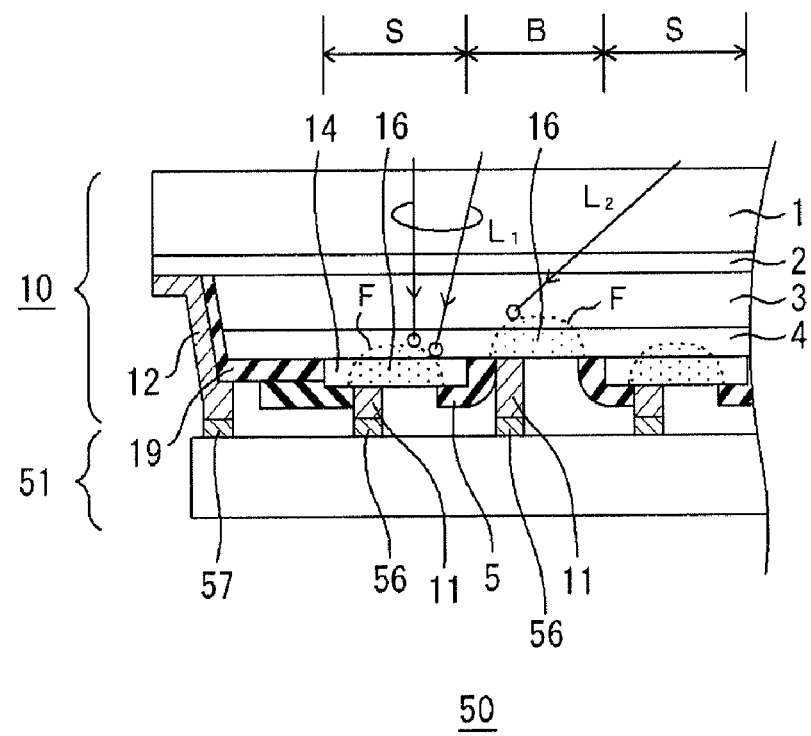
FIG. 3 is a plan view of an image pickup device configured using the photodiode array shown in FIG. 1.

FIG. 3 is a cross-sectional view of an image pickup device 50 configured as a combination of a multiplexer 51 and the photodiode array 10 shown in FIGS. 1 and 2. The p-electrodes 11 of the photodiodes S are electrically connected to input terminals 56 of the multiplexer 51 using, for example, solder bumps not shown in the drawing. Similarly, the n-electrodes 12 to which an identical ground potential is applied are electrically connected to ground-potential terminals 57 of the multiplexer 51.

In FIG. 3, the p-electrode 11 of the anti-crosstalk portion B described above with reference to FIG. 1 is also electrically connected to an input terminal 56 of the multiplexer 51. It should be noted that all the passages of the anti-crosstalk portion B are, as shown in FIG. 1, in continuity, and thus the anti-crosstalk portion B can be regarded as an electrically integrated component; therefore, an electric connection that applies reverse-bias voltage to the anti-crosstalk portion B is needed only at one point. This means that the structure of the anti-crosstalk portion B shown in FIG. 1 needs no other p-electrodes 11.

In FIG. 3, light having a relatively large incident angle, $L_2$, is blocked by the anti-crosstalk portion B whose front F projects out over the plane of incidence and thus makes no contribution to received light signals. On the other hand, light having a relatively small incident angle, namely almost vertical incident light, $L_1$, reaches the photodiodes S relatively distant from the plane of incidence, in other words, the photodiodes S whose front F is located at a lower level than that of the anti-crosslink portion B, thereby contributing to received light signals. Optical crosstalk is thus consistently reduced.

Figure 4:
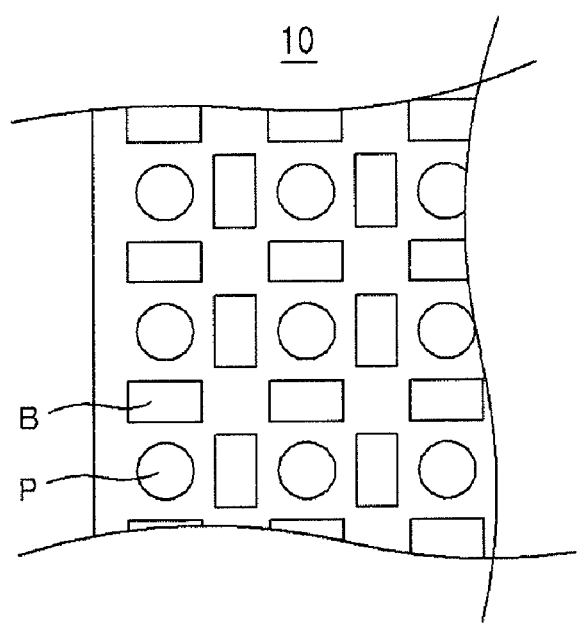
FIG. 4 is a plan view of a variation of the photodiode array shown in FIG. 1.

FIG. 4 is a plan view of a variation of the photodiode array shown in FIGS. 1 and 2. In FIG. 1, the anti-crosstalk portion B of the photodiode array 10 is a continuum completely surrounding the photodiodes S; however, the anti-crosstalk portion B may be constituted of, as shown in FIG. 4, components arranged around the photodiodes S. Even such a broken enclosure can sufficiently prevent optical crosstalk and, furthermore, would significantly reduce optical crosstalk using extended depletion layers when the anti-crosstalk components thereof are exposed to elevated reverse-bias voltage. However, it should be noted that, for the purpose of receiving reverse-bias voltage at the front of the p-type area thereof, namely the pn junction, the arranged anti-crosstalk components B individually need a p-electrode electrically connected to an external terminal.

In the configuration described above, the photodiodes S, which are relatively distant from the light-receiving points, or which have the front F farther away from the InP substrate 1, receive only carriers resulting from non-scattered light, whereas the anti-crosstalk components B trap carriers resulting from scattered light by means of the extended depletion layers and then recombine the carriers there. Optical crosstalk is thus significantly reduced.

A method for manufacturing the above-described photodiode array 10 and image pickup device 50 is as follows. First, an n-type InP buffer layer 2 is formed on an Fe-doped InP substrate 1. The n-type InP buffer layer 2 preferably contains Si, an n-type impurity, so that the carrier concentration may be as high as $3 \times 10^{18}$ cm$^{-3}$ and may be formed by the molecular beam epitaxy (MBE) method, the organometallic vapor-phase epitaxy (OMVPE) method, or some other known method. It should be noted that a film-forming method in which high-concentration hydrogen is used, such as the OMVPE method, preferably includes heat treatment for dehydrogenating the product.

Then, a GaInNAs absorption layer 3 is formed on the n-type InP buffer layer 2. No impurities are needed; however, Si, an n-type impurity, may be added so that the carrier concentration may be approximately $3 \times 10^{15}$ cm$^{-3}$. Although the MBE method is suitable for lowering the hydrogen concentration, the OMVPE method or any similar method may be used instead as long as it is followed by heat treatment for dehydrogenating the product. Subsequently, an InP window layer 4, including an InP additional layer 14, is formed on the GaInNAs absorption layer 3. The carrier concentration of the InP window layer 4 and the InP additional layer 14 is preferably in the order of $10^{17}$ to $10^{18}$ cm$^{-3}$ so that the depletion layers thereof extend toward the GaInNAs absorption layer 3 to an appropriate extent. This is preferably achieved by forming an InP layer until the layer has the intended total thickness of the InP window layer 4 and the InP additional layer 14 and then etching the anti-crosstalk portion B on the InP additional layer. Although dry etching is suitable for lowering the hydrogen concentration, wet etching may be used instead when dry etching takes too long to complete. The thickness of the semiconductor layers is as follows:

InP substrate 1;
n-Type InP buffer layer 2: 1 μm;
GaInNAs absorption layer 3: 3 μm;
InP window layer 4: 0.5 μm; and
InP additional layer 14: 1.5 μm.

When the InP window layer has a thickness of 0.5 μm and the InP additional layer 14 has a thickness of 1.5 μm as above, the distance between the front F and the back surface of the InP substrate 1 in the anti-crosstalk portion B is different from that in the photodiodes S by approximately 1 μm. This 1 μm difference provides the difference in the distance between the front F and the InP substrate 1 itself, thereby reducing optical crosstalk.

Then, a mask pattern 5 that is composed of SiN and has openings corresponding to the anti-crosstalk portion B and the photodiodes S is formed until the thickness thereof reaches 50 nm so as to cover the anti-crosstalk portion B and the photodiodes S completely and, accordingly, the walls of the bumps. Subsequently, Zn, a p-type impurity, is subjected to vapor-phase diffusion to form the p-type areas 16 until they extend to the GaInNAs absorption layer 3 via the InP window layer 4 in the anti-crosstalk portion B and until they reach the InP additional layer 14 or the InP window layer 4 in the photodiodes S. The p-type areas 16 of the photodiodes S may extend only to the inside of the InP additional layer 14, without reaching the InP window 4. Then, p-electrodes 11 that form an ohmic contact with the p-type areas 16 of the individual photodiodes, which extend to the InP window layer 4 or only to the InP additional layer 14, are formed using PtTi or the like on the p-type areas 16. After the end face of the obtained semiconductor laminate is coated with an insulating film 19, n-electrodes 12 that form a uniform ohmic contact with the photodiodes S are formed using AuGeNi or the like around the InP substrate 1 or the n-type InP buffer layer 2.

In the above-described photodiode array and the image pickup device using it, the fronts F of the p-type areas 16 of adjacent photodiodes differ from each other in terms of depth, and this difference in depth screens out markedly angled incident light and allows only carriers resulting from almost vertical light to contribute to light signals. This results in clear images with optical crosstalk being ever-more reduced.

The foregoing described an embodiment of the present invention; however, the above-described embodiment of the present invention is just an example and does not limit the scope of the present invention. The scope of the present invention is defined by what is claimed and includes equivalents of what is claimed and all variations thereof without departing from the scope of the present invention.

The photodiode array and image pickup device according to the present invention provide clear images with optical crosstalk between adjacent photodiodes being significantly reduced.

What is claimed is:

1. A photodiode array comprising a semiconductor laminate having a first conductivity-type semiconductor layer, an absorption layer located above the first conductivity-type semiconductor layer, and a window layer formed on the surface of the absorption layer, and a plurality of photodiodes arranged thereon, wherein
   each adjacent pair of the photodiodes has an anti-crosstalk portion therebetween,
   each of the photodiodes has a second conductivity-type area extending inward from the surface side of the semiconductor laminate,
   the anti-crosstalk portion has a second conductivity-type area extending inward from the surface side of the semiconductor laminate,
   an inner end of the second conductivity-type area of the anti-crosstalk portion, namely a front, is closer to a back surface of the semiconductor laminate than a front of the second conductivity-type area of each of the photodiodes, and
   a thickness of the window layer is larger in the photodiodes than in the anti-crosstalk portion.

2. The photodiode array according to claim 1, wherein the second conductivity-type area of each of the photodiodes extends only within the window layer and that of the anti-crosstalk portion reaches the absorption layer.

3. An image pickup device obtained by mounting the photodiode array according to claim 1 with an epi-side thereof facing down so that the back surface is used as a plane of incidence.

4. The image pickup device according to claim 3, wherein the front of the second conductivity-type area of the anti-crosstalk portion is exposed to reverse-bias voltage.

* * * * *